(12) United States Patent
Sakamoto

(10) Patent No.: US 6,519,748 B2
(45) Date of Patent: Feb. 11, 2003

(54) SIGNAL DELAY TIME CALCULATION METHOD OF SEMICONDUCTOR INTEGRATED CIRCUIT AND COMPUTER PROGRAM PRODUCT FOR EXECUTING THE METHOD

(75) Inventor: Toshiyuki Sakamoto, Yokohama (JP)

(73) Assignee: Kabushiki Kaisha Toshiba, JPX ( * ) Notice: Subject to any disclaimer, the term of this patent is extended or adjusted under 35 U.S.C. 154(b) by 3 days.

(21) Appl. No.: 09/895,339

(22) Filed: Jun. 29, 2001

(65) Prior Publication Data

US 2002/0016950 A1 Feb. 7, 2002

(30) Foreign Application Priority Data

Jun. 30, 2000 (JP) ........................................ 2000-199010

(51) Int. Cl.$^7$ .............................................. G06F 17/50
(52) U.S. Cl. ................................. 716/6; 716/4; 364/481
(58) Field of Search ..................... 706/3, 4, 6; 364/481, 364/482, 487, 488, 489

(56) References Cited

U.S. PATENT DOCUMENTS

| | | | |
|---|---|---|---|
| 5,313,398 A | 5/1994 | Rohrer et al. | ................ 364/468 |
| 5,379,231 A | 1/1995 | Pillage et al. | ................ 364/488 |
| 6,223,328 B1 * | 4/2001 | Ito et al. | ........................ 716/6 |

OTHER PUBLICATIONS

Oshima et al.., "A Delay Calculator System for Deep Sub-micron Design", Mar. 1999, Technical Report of IEICE, VLD98–137, p. 43–49.

O'Brien et al.., "Modeling the Driving–Point Characteristic of Resistive Interconnect for Accurate Delay Estimation", 1989, Proceedings IEEE International Conference on Computer–Aided Design, p. 512–515.

Dartu et al., "A Gate–Delay Model for High–Speed CMOS Circuits", 1994, Proceedings 31$^{st}$ ACM/IEEE Design Automation Conference, p. 576–580.

Dartu et al., "Performance Computation for Precharacterized CMOS Gates with RC Loads", 1994, IEEE Transactions on Computer–Aided Design of Integrated Circuits and Systems, vol. 15, No. 5, p. 544–563.

Rubinstein et al., "Signal Delay in RC Tree Networks", Jul. 1983, IEEE Transactions on Computed–Aided Design, vol. CAD–2, No. 3, p. 202–211.

Pillage et al., "Asymptotic Waveform Evaluation for Timing Analysis", Apr. 1990, IEEE Transactions on Computer–Aided Design, vol. 9, No. 4, p. 352–366.

Anastasakis et al., "On the Stability of Moment–Matching Approximations in Asymptotic Waveform Evaluation", 1992, Proceedings 29$^{th}$ ACM/IEEE Design Automation Conference, p. 207–212.

* cited by examiner

Primary Examiner—Tuan T. Lam
Assistant Examiner—An T. Luu
(74) Attorney, Agent, or Firm—Gray Cary Ware & Freidenrich LLP

(57) ABSTRACT

In a signal delay time calculation method of calculating an approximate signal delay time in an LSI based on AWE in which a signal voltage waveform is calculated by using terms of an admittance up to n-th order obtained by Laplace transform for the LSI. Even if there are one or more poles of the signal having a real-number part of more than zero, it is determined to obtain a high-accuracy signal delay time when the delay time is obtained within a range to which those poles provide smaller effect.

12 Claims, 7 Drawing Sheets

SIGNAL DELAY TIME CALCULATION METHOD OF SEMICONDUCTOR INTEGRATED CIRCUIT AND COMPUTER PROGRAM PRODUCT FOR EXECUTING THE METHOD

CROSS-REFERENCE TO RELATED APPLICATION

This application claims benefit of priority under 35 USC §119 to Japanese Patent Application No. P2000-199010, filed on Jun. 30, 2000, the entire contents of which are incorporated herein by reference.

BACKGROUND OF THE INVENTION

1. Field of the Invention

The present invention relates to a signal delay time calculation method of calculating a signal delay in a digital circuit in an LSI, and, more particularly, relates to a signal delay time calculation method of calculating a delay time in a circuit designed by using data items of actual wiring after making a layout pattern of the LSI, and relates to a computer program product for executing the signal delay time calculation method by a computer system.

2. Description of the Related Art

Recently, there is a strong progress toward miniaturization in LSI fields. In this progress, the submicron technology is thereby widely used. Therefore signal delay becomes an important element in LSI design field.

The signal delay is always divided into two parts, a cell delay and a wiring delay. The cell delay is a delay in the cell itself, which is calculated based on the state of the cell, the input signal transition time (or "transition time" in short), and a load capacity of wiring and connected pins to be driven.

The wiring delay is a delay based on a resistance in wiring, and the wiring delay is obtained by subtracting the cell delay from the entire delay.

In general, ELMORE's equation is used for calculating the wiring delay that has been disclosed in following literatures (A) and (B):

(A) "The transient response of damped linear networks with particular regard to wideband amplifiers", W. C. Elmore, J. Appl. Physics vol.19, No.1, pp.55–63, January 1948; and (B) "Signal Delay in RC Tree Networks", J. Rubinstein, P. Penfield Jr., and M. A. Horowitz, IEEE Trans. on Computer-Aided Design, Vol.CAD-2, No.3, July 1983.

However, according to the trend toward the miniaturization in the LSI field where a very-small region smaller in area than a submicron region (named as "deep-submicron") is used in order to increase the density of an LSI layout, a calculation result of the signal delay using the value "zero" as a resistance of wiring becomes not agreed with an actual delay time obtained by considering detailed wiring resistances in the LSI performed by SPICE (Simulation Program with Integrated Circuit Emphasis) and the like. In addition, the use of ELMORE's equation cannot obtain an adequate approximate-value of the delay time.

There is a phenomenon to reduce the delay time as one reason of the disagreement between these delay times, because a capacitance of a position which is separated from a driver pin through which the wiring is driven is sealed by the wiring resistance and the actual load capacitance relating to a change of the voltage of the output pin from the current voltage to the threshold voltage is smaller than that of the sum of capacitances in the load. By the presence of this phenomenon, the conventional calculation for the signal delay time outputs a larger value of a signal delay time that is greater than the actual value of the signal delay. When this calculated value of the signal delay is used, the actual circuit manufactured enters error operation even if a simulator or a static timing analyzer using the calculated delay value of the signal delay offers a guarantee that this circuit operates correctly without any error operation. An concrete example shown in FIG. 14, because the simulator or the static timing analyzer can use a correct delay value for the clock signal indicated by the waveform 3, and provides a larger delay value for the data bus of the waveform 1, they guarantee that the circuit has no timing error, but, actual operation causes a hold error of the waveform 2, as shown in FIG. 14.

Although it is possible to increase the accuracy of the simulation by using a high accuracy simulator such as SPICE and to eliminate the above conventional drawback, the operation of the high accuracy simulator operates with lower speed. Accordingly, it is impossible to use the high accuracy simulator such as SPICE for a very large-scale integrated circuit because it takes a very long calculation time period. In order to avoid this problem and to calculate the delay time with higher speed, various methods other than the high accuracy simulator such as SPICE have been studied. One of them is AWE (Asymptotic Waveform Evaluation) that was proposed in about 1990. Many papers regarding AWE have been published. The following literature (C) shows a general outline of AWE in detail:

(C) "Asymptotic Waveform Evaluation for Timing Analysis", Lawrence T. Pillage and Ronald A. Rohrer, IEEE Transaction on Computer-Aided Design, Vol.9, No.4, April 1990, 352–366.

Next, a description will be given of a brief explanation of AWE.

In AWE, a signal waveform to be finally calculated is expressed by the following equation (1)

$$Const + \sum_{i}^{n} Ki \times \exp(Pi \times t). \tag{1}$$

When Laplace transform is applied to the signal waveform (1), the following equation (2) can be obtained.

$$\frac{Const}{s} + \sum_{i}^{n} \frac{Ki}{S - Pi}. \tag{2}$$

The equation (2) will be referred to as "waveform 1".

Next, Laplace transform is applied to an admittance of a target circuit and a power source voltage until $S^n$. By using the result, the waveform that has been obtained by performing Laplace transform for an actual signal waveform is obtained until $S^n$. The result will be referred to as "waveform 2".

In AWE, coefficients of S in both the waveform 1 and the waveform 2 are compared until n-th power, respectively, in order to obtain simultaneous equations. Then, the simultaneous equations are solved in order to obtain the values "Ki" and "Pi" in the equation (2). "Ki" is called to as "residue", and "Pi" to as "pole".

Section 3.3 (regarding Stability, see page p.357) in the above literature (C) described a case that there is no solution or a positive solution of the real part of the pole "Pi" in lower degree, and therefore AWE can obtain solution in a higher degree rather than the above lower degree. This means that there is no signal waveform of diverging in the calculation for a normal signal waveform and the positive solution of the real part of the pole "Pi" do not become a correct approximation in adequately large time period.

In addition, Section 3.1 (regarding AWE Approximation) in the above literature (C) described a case that a calculation value can be obtained with a third degree order time of "q" when a degree of an approximation solution is "q". Thus, because the degree is greater, the amount of the calculation is also increased substantially. Therefore, in concrete application programs, although it is necessary to perform the calculation with a lower degree as lower as possible so that actual real parts of all poles become negative values in order to prevent the increasing of the amount of the calculation, it is difficult to determine the value of the degree correctly and efficiently.

In order to solve the above problem, namely to obtain a method of obtaining a stable solution, there was the following literatures (D) and (E):

(D) "On the Stability of Moment-Matching Approximations in Asymptotic Waveform Evaluation", D. F. Anastasakis, N. Gopal, S. Y. Kim, and L. T. Pillage, Proceedgins 29th ACM/IEEE Design Automation Conference, 207–212; and
  (E) "Method and Apparatus for Simulating a Microelectric Interconnect Circuit", Pillage et al., U.S. Pat. No. 5,379,231.

These literatures (D) and (E) disclosed the method of obtaining a pole by shifting a moment and then of obtaining a residue by using a moment that has not been shifted if it is difficult to obtain a stable solution. However, this method requires the calculation for moments as large as possible by the shift value under a prediction where a correct value can be obtained. This raises a problem to take a long calculation time.

There is a literature (F) to make a model of a cell using AWE.

(F) "A Gate-Delay Model for High-Speed CMOS Circuits", Florentin Dartu, Noel Menezes, Jessica Qian and Lawrence T. Pillage, Proceedings 31st ACM/IEEE Design Automation Conference, 576–580.

FIGS. 15 and 16 show a model of an output pin in a cell. It is approximated that the output pin 100 in the cell shown in FIG. 15 is connected to the power source voltage Vd 101 through an internal resistance Rd102. Hereinafter, the voltage at the output pin 100 of the cell in the model shown in FIG. 15 and FIG. 16 is designated by Vdrive. FIG. 16 shows the change of the power source voltage Vd101 shown in FIG. 15 having a signal transition time ΔT whose change is started at Time t0 when an input signal (designated by a dotted line) crosses a threshold voltage at Time zero. However, it is not always necessary to define the effective capacitance (Ceff) as a capacitance having a current that is equal in amount to a mean current between ΔT of the power source voltage of a ramp waveform in the cell, as described in the above literature (F), for the effective capacitance (Ceff). It is possible to define the effective capacitance Ceff as a capacitance having a time that is equal to the time at which the voltage on the output pin 100 driving the wiring crosses the threshold voltage Vth.

Further, the method disclosed in the literature (F) make a request to measure and obtain cell parameters t0, ΔT, and Rd as the characteristics of a cell. However, it has more convenience that these cell parameters are calculated based on the characteristic values in the cell that have been measured.

The following literature (G) disclosed the method to obtain the cell parameters t0 and ΔT based on already-measured values.

(G) "A delay Calculation System for Deep Submicron Design", Oshima et al., P43–49, TECHNICAL REPORT of IEICE, VLD98-137 (1999-03),.

However, Equation (3) used in the above literature (G) is based on the hypothesize in which the waveform of an output signal is a ramp waveform. This arises a larger error. In addition, the above literature (F) also described that an internal resistance value is calculated from the waveform of an output signal. Furthermore, the above literature (G) did not report that the internal resistance Rd is converted from an existing characteristic value of a cell that has already been measured. In order to calculate the internal resistance Rd based on the the waveform, it must be necessary to measure the characteristic of the cell again. However, it is a convenience that the cell parameters such as the internal resistance Rd, the value t0, and the value ΔT are calculated based on the characteristic value of the cell that has already been measured.

As described above, in the conventional AWE methods to calculate a signal delay time in LSI, it is necessary to obtain the solution with a degree as lower as possible in order to reduce the amount of calculation. However, it is difficult to determine the value of the degree in order to obtain a correct solution. There were various methods to solve this conventional drawback, they require much calculation time.

On the other hand, in the conventional method to make a model based on AWE, cell parameters to be used in calculation can be obtained from existing measured-values. However, because the hypothesize in which the waveform of the output signal is a ramp (shaped) waveform is used, there is a drawback that an error of each cell parameter becomes large. In order to calculate one cell parameter based on the waveform of the output signal, it is necessary to measure the characteristic of the cell again.

SUMMARY OF THE INVENTION

Accordingly, an object of the present invention is, with due consideration to the drawbacks of the conventional technique, to provide a signal delay time calculation method of calculating a signal delay time in LSI and to provide a computer program product for executing this method by a computer system capable of easily and preciously calculate the signal delay time in LSI with short time.

In accordance with an embodiment of the present invention, a signal delay time calculation method is executed based on Asymptotic Waveform Evaluation (AWE) of calculating an approximate signal delay time in a semiconductor integrated circuit (LSI) by calculating a voltage waveform of a signal by using terms of an admittance up to n-th order obtained by performing Laplace transform for the LSI. This signal delay time calculation method comprises: first step of calculating an admittance of the LSI by performing Laplace transform; second step of calculating a first voltage waveform obtained by Laplace transform of a power source voltage for driving the admittance obtained by Laplace transform in the first step; third step of calculating a second voltage waveform obtained by Laplace transform of voltage at an optional point in the LSI based on the admittance obtained in the first step and the first voltage waveform obtained in the second step; fourth step of calculating a real-time approximate voltage waveform of the second voltage waveform by obtaining poles and residues of the second voltage waveform; fifth step of calculating a signal delay time in the LSI based on the real-time voltage waveform obtained in the fourth step; and sixth step of judging whether the signal delay time obtained in the fifth step is within an acceptable precision range when one or more poles obtained in the fourth step include a real-number part of more than zero.

BRIEF DESCRIPTION OF THE DRAWINGS

These and other objects, features, aspects and advantages of the present invention will become more apparent from the following detailed description of the present invention when taken in conjunction with the accompanying drawings, in which.

DETAILED DESCRIPTION OF THE PREFERRED EMBODIMENTS

Figure 1:
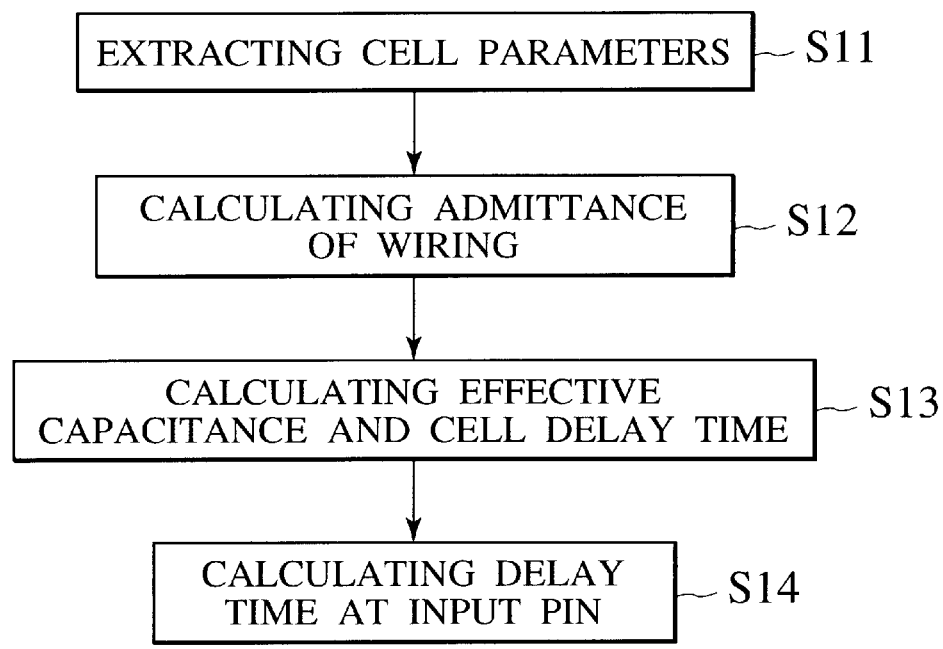
FIG. 1 is a flow chart showing the procedure of a signal delay time calculation method of calculating a signal delay time in an LSI according to the first embodiment of the present invention.

Other features of this invention will become apparent through the following description of preferred embodiments which are given for illustration of the invention and are not intended to be limiting thereof.
First embodiment FIG. 1 is a flow chart showing the procedure of a signal delay time calculation method of calculating a signal delay time in an LSI according to the first embodiment of the present invention. In FIG. 1, the entire flow of the procedure is roughly divided into four steps, Step of extracting cell parameters in a cell (Step S11), Step of calculating an admittance of wiring (Step S12), Step of calculating an effective capacitance and a cell delay (Step S13), and Step of calculating a delay time at an input pin (Step S14). In the procedure, the feature of the technology according to the present invention will be used in each of the Steps, Extracting the cell parameters, Calculating the effective capacitance and cell delay, and Calculating the delay time at an input pin.

Figure 15:
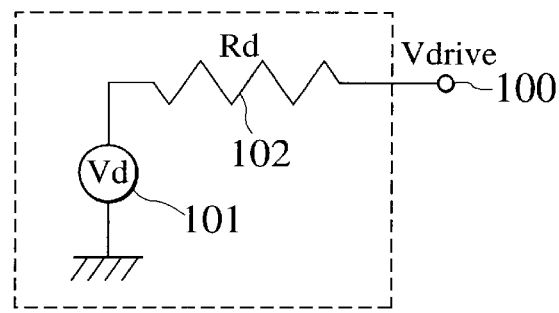
FIG. 15 is a diagram showing a model of an output pin in a cell.

Next, a description will be given of the Step S11 of calculating the internal resistance Rd shown in FIG. 15, the change-starting time t0 of an output signal shown in FIG. 16, and the signal transition time ΔT shown in FIG. 16 based on existing cell parameters that have already been measured, namely, a transition time of the output signal on the output pin as a function of an input signal transition time and an output load capacitance of each state dependent path, and a cell delay data item as a function of the signal transition time and the output load capacitance of each state dependent path.

Figure 2:
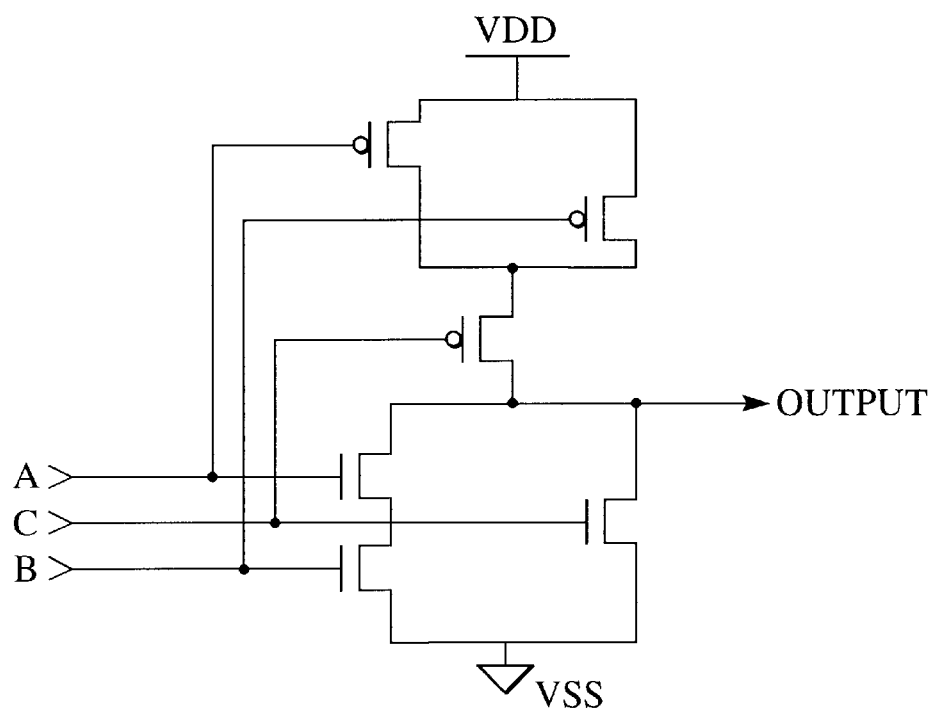
FIG. 2 is a diagram showing an example of a cell having a state-depended delay time.

In this case, the state-dependent path is a path in which the internal resistance of a CMOS circuit having a NOT ((A AND B) OR C) function shown in FIG. 2 is changed according to the state (namely, the level) of input signals A and B. That is, the configuration of the PMOS transistors in the path in the CMOS circuit is changed according to the following two cases because the number of the PMOS transistors in ON state (active state) are changed when the level of the output signal is switched from Low to High by switching the level of an input signal C from High to Low. Thus, the internal resistance is different in the above two cases:

Only one of signals A and B is Low; and

Both signals A and B are Low.

The internal resistance Rd is a function of the rising of the signal, the falling of the signal at the output pin, and the state-dependent path, and the cell parameters t0 and ΔT are a function of the rising, the falling, the state-dependent path of the signal at the output pin, an input signal transition time, and a load capacity. There is a case where the transition time of the output signal and the cell delay are expressed by an equation form or a table form.

Figure 3:
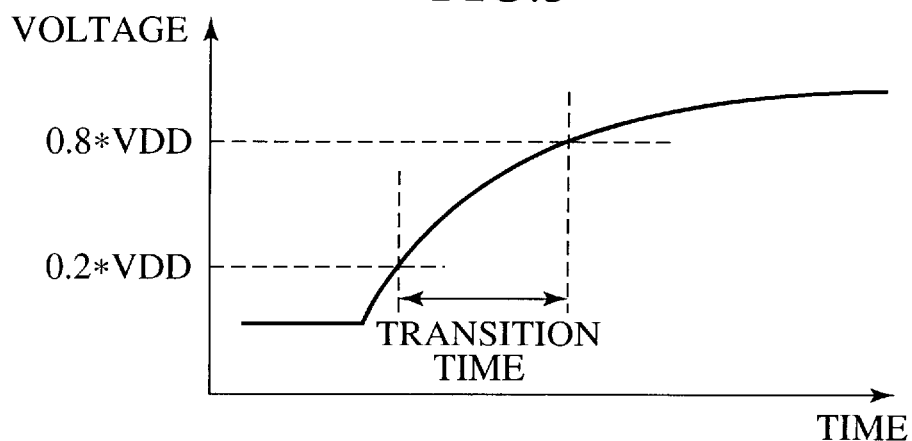
FIG. 3 is a diagram showing an example of a signal transition time.

Here, as shown in FIG. 3, it is defined that the signal transition time is a time from 0.2×VDD to 0.8×VDD when the power source voltage is VDD and VSS=0 V. Although there are various definitions to define the signal transition time, they are same intrinsically, and converted to each other easily. Accordingly, in the following explanation, the case to change the level of the output signal from Low to High is expressed based on the definition shown in FIG. 3.

Figure 4:
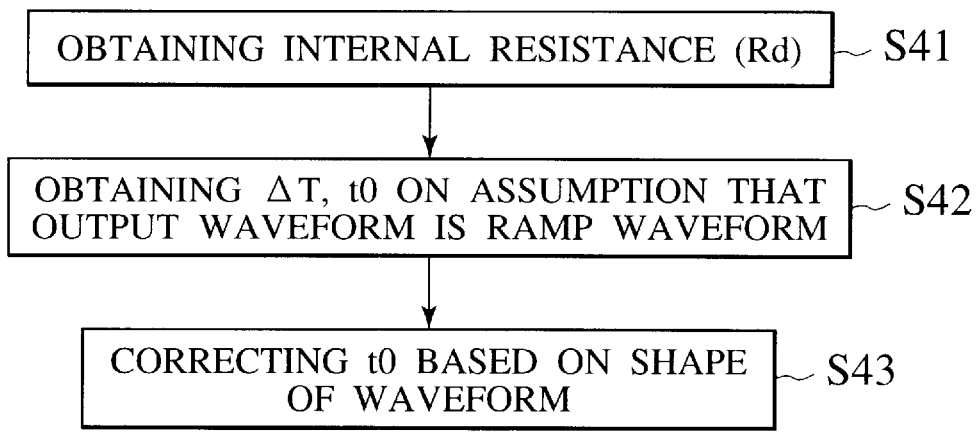
FIG. 4 is a flow chart showing the procedure to extract cell parameters.
Figure 5:
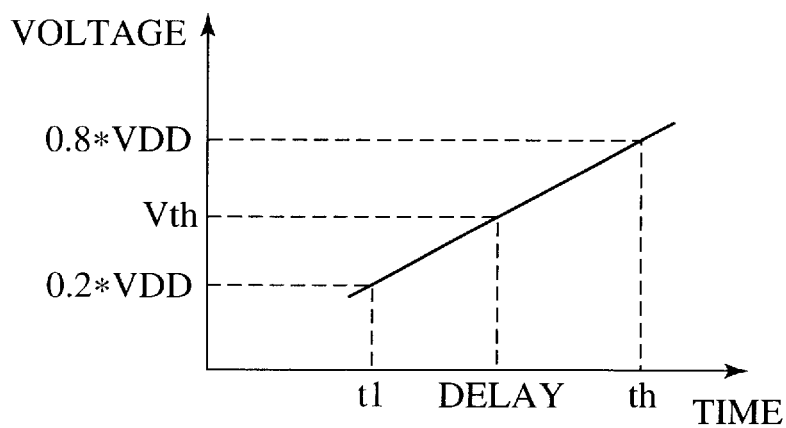
FIG. 5 is a diagram showing an example of an approximate output waveform.

FIG. 4 is a flow chart showing the rough procedure to extract cell parameters. In Step S41 of FIG. 4, it is necessary to calculate the internal resistance Rd per state-dependent path, the rising of the signal, and the falling of the signal. But, when the amount of the load is large adequately, it is possible to approximate the waveform of the internal resistance Rd as a step-shaped waveform. It is therefore possible to approximate the waveform of the voltage Vout at the output pin as follows:

$$Vout \approx VDD \times \left[1 - \exp\left[\frac{-t}{Rd \times C}\right]\right], \quad (3)$$

Where $Vout = 0$ under $t = 0$, and $C$ is a load capacitance

When "t1" is the time of 0.2×VDD, and "th" is the time of 0.8×VDD, the following equations (4-1) and (4-2) can be obtained:

$$VDD \times \left[1 - \exp\left[\frac{-t1}{Rd \times C}\right]\right] = 0.2 \times VDD, \text{ and} \quad (4\text{-}1)$$

$$VDD \times \left[1 - \exp\left[\frac{-th}{Rd \times C}\right]\right] = 0.8 \times VDD. \quad (4\text{-}2)$$

When these equations (4-1) and (4-2) are solved, the following solutions can be obtained:

$$t1 = -\ln 0.8 \times Rd \times C \quad (5\text{-}1), \text{ and}$$

$$th = -\ln 0.2 \times Rd \times C. \quad (5\text{-}2)$$

Accordingly, the transition time becomes as follows:

$$th - t1 = (-\ln 0.2 + \ln 0.8) \times Rd \times C \quad (6)$$
$$= \ln 4 \times Rd \times C$$

In the case that the transition time is expressed by K0+K1×C, it is possible to neglect the term K0 because the value C is large. Therefore the following equations (7-1) and (7-2) can be obtained:

$$\ln 4 \times Rd \times C = K0 + K1 \times C \quad (7\text{-}1), \text{ and}$$

$$Rd \approx \frac{K1}{\ln 4}. \quad (7\text{-}2)$$

The value of the internal resistance Rd can be calculated based on the above equations (7-1) and (7-2).

By the way, it is possible to express the transition time of the output signal by the following table (8).

$$\begin{bmatrix} a11 & a12 & a13 & a14 \\ a21 & a22 & a23 & a24 \\ a31 & a32 & a33 & a34 \\ a41 & a42 & a43 & a44 \end{bmatrix} \quad (8)$$

In the matrix table (8), each of values (a11, a12, a13, a14) in one lateral line is a capacitance, loadp1, loadp2, loadp3, loadp4, respectively, and having the relationship, loadp1<loadp2<loadp3<loadp4. Each of value (a11, a21, a31, a41) in one vertical line designates the transition time of the input signal, Slew1, Slew2, Slew3, Slew4, respectively and having the relationship of Slew1<Slew2<Slew3<Slew4.

First, it is possible to consider that the waveform of the voltage Vd is approximately equal to the step-shaped waveform when the input signal is almost equal to the step-shaped waveform. Therefore, the internal resistance Rd can be obtained by using the following equation (9) in which the points a13 and a14 having the maximum capacitance and the smallest transition time of the input signal are used.

$$Rd \approx \left[\frac{a14 - a13}{Loadp4 - Loadp3}\right] \times \frac{1}{\ln 4}. \quad (9)$$

In order to obtain a more precious solution, it is possible to obtain the solution by performing extrapolation when the input signal transition time is zero and the capacitance is an infinite value.

Next, a description will be given of the calculation method of obtaining the cell parameters ΔT and t0 in Step S42 in which the value Rd obtained in Step S41 is used as a fixed value and it is assumed that the output waveform of the output signal has the ramp (shaped) waveform.

When "Vdrive" designate the waveform of the voltage in a case that the output pin of the cell has a capacitance C, the following explanations (10-1), (10-2), and (10-3) can be obtained:

$$Vdrive(t, t0, \Delta T) = 0 \quad (t < t0). \quad (10\text{-}1)$$

$$Vdrive(t, t0, \Delta T) = \quad (10\text{-}2)$$
$$VDD \times \left[\frac{t - t0}{\Delta T} - \frac{Rd \times C}{\Delta T} \times \left[1 - \exp\left[\frac{-(t - t0)}{Rd \times C}\right]\right]\right]$$
$$(t0 < = t < t0 + \Delta T),$$

$$Vdrive(t, t0, \Delta T) = \quad (10\text{-}3)$$
$$VDD \times \left[1 - \frac{Rd \times C}{\Delta T} \times \left[1 - \exp\left[\frac{-\Delta T}{Rd \times C}\right]\right] \times \exp\left[\frac{\Delta T - (t - t0)}{Rd \times C}\right]\right]$$
$$(t >= t0 + \Delta T).$$

It is defined that "INSLEW" designates the input signal transition time at the input pin, "OUTSLEW" denotes the transition time of the output signal at the output pin when the load capacitance is C, and "DELAY" indicates the value of the cell delay. When "Vth" designates the threshold voltage, the voltage becomes 0.2 VDD at the time "t1" and the voltage becomes 0.8 VDD at the time "th", the following equations:

$$Vdrive(t1, t0, \Delta T) - 0.2 \times VDD = 0, \quad (11\text{-}1)$$

$$Vdrive(th, t0, \Delta T) - 0.8 \times VDD = 0, \quad (11\text{-}2)$$

$$th - t1 = OUTSLEW \quad (11\text{-}3), \text{ and}$$

$$Vdrive(DELAY, t0, \Delta T) - Vth = 0. \quad (11\text{-}4)$$

That is, it is possible to obtain the parameter values t0 and ΔT by solving the above equations (10-1) to (10-4). However, because the Vdrive is not linear equation, it is difficult to solve the equations (10-1) to (10-4). Here, it is assumed that the output waveform becomes linear between t"1", "DELAY", and "th" in this calculation stage.

The values "t1" and "th" are approximated as follows:

$$t1 \approx DELAY - \frac{5}{3} \times \left[\frac{Vth}{VDD} - 0.2\right] \times OUTSLEW, \quad (12\text{-}1)$$

$$th \approx DELAY + \frac{5}{3} \times \left[0.8 - \frac{Vth}{VDD}\right] \times OUTSLEW. \quad (12\text{-}2)$$

Figure 6:
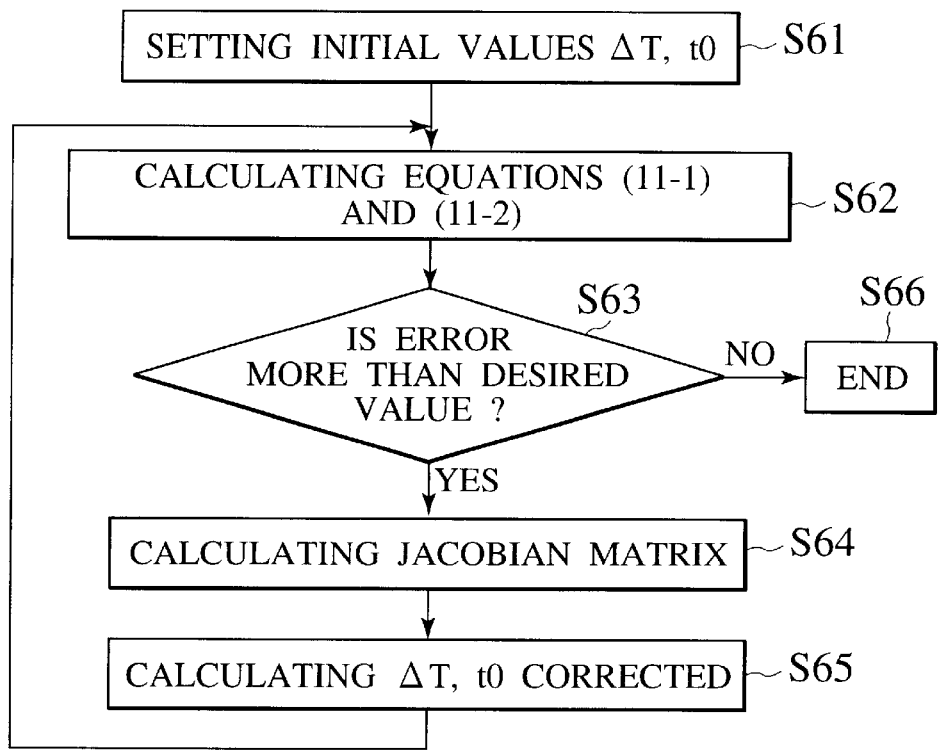
FIG. 6 is a flowchart showing the procedure of a first approximation calculation to obtain cell parameters t0 and ΔT.

The equations (11-1) to (11-4) are solved based on Newton's method according to the approximation calculation's flow shown in FIG. 6 by inserting the equations (12-1) and (12-2) into the equations (11-1) and (11-2). In Step S61 shown in FIG. 6, the initial values ΔT and t0 are given. The value that has been obtained in Step S41 is used as the value "Rd". In Step S62, the left sides of the equations (11-1) and (11-2) are solved by using the values "th" and "t1" that have been obtained by the equations (12-1) and (12-2).

The calculation is terminated (Step S66) only when both the values of the left sides of the equations (11-1) and (11-2) are below a predetermined value (in the comparison at Step S63).

The values ΔT and t0 under the termination of the calculation become solutions. On the other hand, the operation flow proceeds to Step S64 when either absolute value of the left sides of the equations (11-1) and (11-2) is more than a predetermined value (in the comparison at Step S63). In Step S64, the calculation of Jacobian matrix is performed as follows:

$$\frac{dVdrive}{dt0} = 0 \quad (t < t0), \tag{13-1}$$

$$\frac{dVdrive}{dt0} = VDD \times -\frac{1}{\Delta T} \times \left[1 - \exp\left[\frac{-(t-t0)}{Rd \times C}\right]\right]$$

$$(t0 < = t < \Delta T + t0),$$

$$\frac{dVdrive}{dt0} = VDD \times -\frac{1}{\Delta T} \times \left[1 - \exp\left[\frac{-\Delta T}{Rd \times C}\right]\right] \times$$

$$\exp\left[\frac{\Delta T - (t - t0)}{Rd \times C}\right]$$

$$(t > = \Delta T + t0).$$

$$\frac{dVdrive}{d\Delta T} = 0 \quad (t < t0), \tag{13-2}$$

$$\frac{dVdrive}{d\Delta T} = VDD \times -\frac{1}{(\Delta T)^2} \times [t - t0 - Rd \times C \times$$

$$\left[1 - \exp\left[\frac{-(t-t0)}{Rd \times C}\right]\right]]$$

$$(t0 < = t < \Delta T + t0),$$

$$\frac{dVdrive}{d\Delta T} = VDD \times \left[\frac{Rd \times C}{(\Delta T)^2} \times \left[1 - \exp\left[\frac{-\Delta T}{Rd \times C}\right]\right]\right] \times$$

$$\exp\left[\frac{\Delta T - (t - t0)}{Rd \times C}\right] - \frac{1}{\Delta T} \times \exp\left[\frac{\Delta T - (t - 0)}{Rd \times C}\right]]$$

$$(t > = \Delta T + t0).$$

By using the relationships (13-1) and (13-2), the calculation of Jacobian matrix can be performed by using following values Y11, Y12, Y21, and Y22.

$$Y11 = \frac{dVdrive}{dt0}(t1, t0, \Delta T), \tag{14}$$

$$Y12 = \frac{dVdrive}{d\Delta T}(t1, t0, \Delta T),$$

$$Y21 = \frac{dVdrive}{dt0}(th, t0, \Delta T),$$

$$Y22 = \frac{dVdrive}{d\Delta T}(th, t0, \Delta T).$$

New t0 and ΔT can be calculated by using the above Jacobian as follows:

$$\begin{bmatrix} t0_{K+1} \\ \Delta T_{K+1} \end{bmatrix} = \begin{bmatrix} t0_K \\ \Delta T_K \end{bmatrix} - \tag{15}$$

$$\begin{bmatrix} Y11 & Y12 \\ Y21 & Y22 \end{bmatrix}^{-1} \begin{bmatrix} Vdrive(t1, t0_K, \Delta T_K) - 0.2 \times VDD \\ Vdrive(th, t0_K, \Delta T_K) - 0.8 \times VDD \end{bmatrix},$$

where $t0_K$ and $\Delta K$ are $k$-th calculation values.

The following is an inverse matrix.

$$\begin{bmatrix} Y11 & Y12 \\ Y21 & Y22 \end{bmatrix}^{-1}. \tag{16}$$

In Step S65, values ΔT and t0 are corrected by using the Jacobian and the operation flow returned to Step S62.

The value t0 obtained at Step S42 shown in FIG. 4 involves an error because Step S42 uses the approximation equations (12-1) and (12-2). The error of t0 is corrected at Step43 in FIG. 4.

Next, a description will be given of the correction operation for the value t0.

Figure 7:
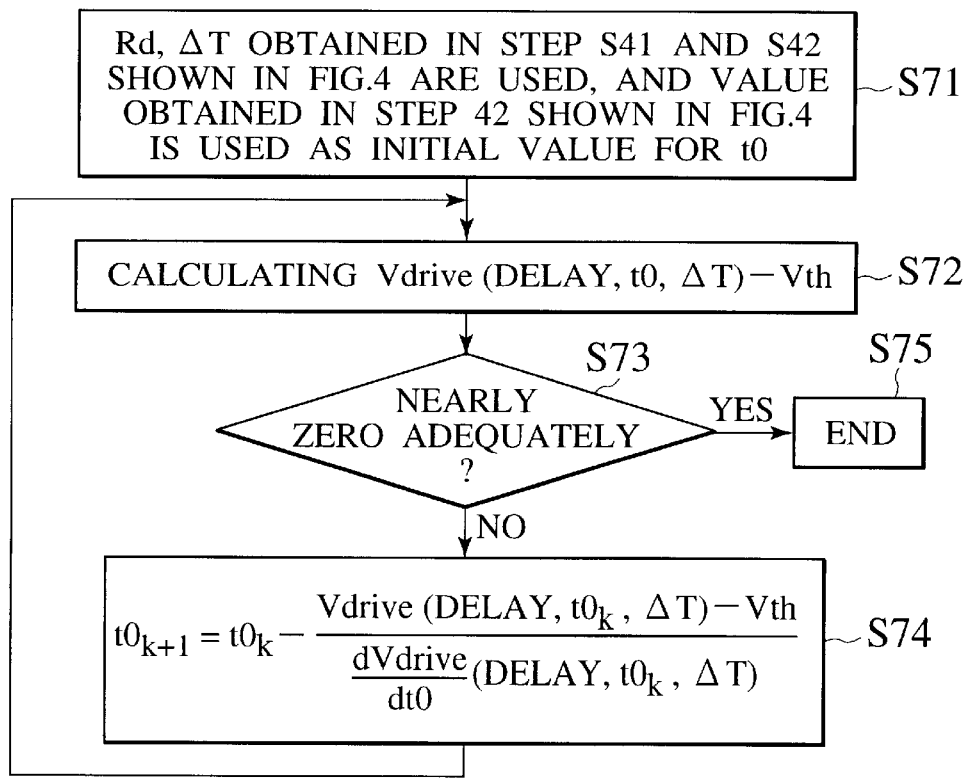
FIG. 7 is a flowchart showing the procedure of a correction calculation for the cell parameter t0.

FIG. 7 is a flowchart showing the calculation of Newton's method in which t0 designates a variable. In Step S71 of FIG. 7, the calculation is initiated by using t0 obtained in Step S42 as an initial value, Rd obtained in Step S41, and ΔT obtained in Step S42 of FIG. 4. In Step S72 of FIG. 7, the equation (11-4) is calculated. In Step S73 of FIG. 7, the calculation is completed and t0 is used as a solution only when the left side of the equation (11-4) is adequately small. On the other hand, the operation flow proceeds to Step S74 when not adequately small. In Step S75 of FIG. 7, a new value t0 is calculated, and the operation flows returns to Step S72. Although the values t0 and ΔT as the final calculation result can be calculated per calculation for the circuit delay time, it is possible to calculate them in advance and to use them by interpolation and extrapolation. This can achieve to reduce the calculation time for the delay time of the circuit.

It is possible to use the method disclosed in the literature (H) in order to extract the admittance that is obtained by Laplace transform from wiring in the admittance calculation of the wiring performed in Step S12 shown in FIG. 1.

(H) "Modeling the Driving-Point Characteristic of Resistive Interconnect for Accurate Delay Estimation", P. R. O'Brien and T. L. Savarino, Proc.IEEE International Conference on Computer-Aided Design, 1989.

The following shows the calculation result of the order that is higher than that of the method used in the literature (H). Next, a description will be given of the operation of this method.

First, the admittance obtained by Laplace transform at the output pin in the cell is obtained in n-th order of S. n=4 in AWE of second order, and n=6 in AWE of third order. In the following explanation, the sixth order of S will be shown.

In the literature (H), it is assumed that wiring has a tree structure where the output pin is the root. By applying the following five rules (R1) to (R5), it is possible to obtain Laplace transform of n-th order of the admittance of the wiring that is observed from the position of the output pin.

(R1) The calculation order is from FANOUT side to FANIN.

This means that the calculation direction is from the input pin side to the output pin side that drives the wiring.

(R2) INITIAL VALUE=0

Figure 8:
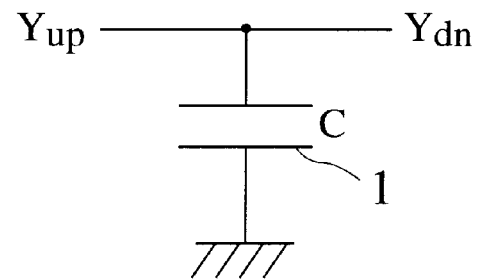
FIG. 8 is a diagram showing a connection of a capacitance in an admittance calculation of wiring.

(R3) C (Capacitance) RULE:

The capacitance is connected as shown in FIG. 8. In FIG. 8, "Yup" designates an admittance that is close to the output pin for driving through the capacitance 1. "Ydn" denotes an admittance that is close to the input pin through the capacitance 1.

According to the law of the conservation of current, the following equations can be obtained:

$$Yup(S) \times V(S) = Ydn(S) \times V(S) + S \times C \times V(S). \tag{17}$$

Therefore, $$Yup(S) = Yup1 \times S + Yup2 \times S^2 + Yup3 \times S^3 + Yup4 \times S^4 + Yup5 \times S^5 + Yup6 \times S^6 + O(S^7),$$

$$Ydn(S) = Ydn1 \times S + Ydn2 \times S^2 + Ydn3 \times S^3 + Ydn4 \times S^4 + Ydn5 \times S^5 + Ydn6 \times S^6 + O(S^7). \tag{18}$$

The following relationships can be obtained.

$Yup1 = Ydn1 + C,$ $Yup2 Ydn2,$ $Yup3 = Ydn3,$ $Yup4 = Ydn4,$

Yup5=Ydn5, and

Yup6=Ydn6. (19)

(R4) R RULE

Figure 9:
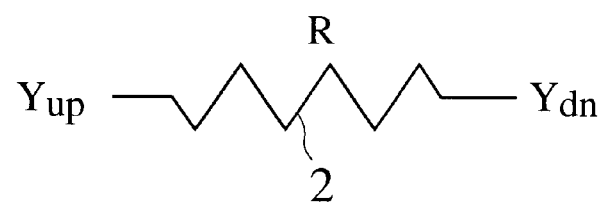
FIG. 9 is a diagram showing a connection of a resistance in an admittance calculation of wiring.

The resistance 2 is connected in the configuration shown in FIG. 9. In FIG. 9, Yup designates the admittance that is close to the output pin for driving through the resistance 2. Ydn denotes the admittance that is close to the input pin through the resistance 2. Vup(S) indicates Laplace transform of the voltage at a point that is close to the output pin for driving through the resistance 2. Vdn(S) designates Laplace transform of the voltage at a point that is far from the output pin through the resistance 2. The following can be obtained based on the law of the conservation of current.

$$Yup(S) \times Vup(S) = Ydn(S) \times Vdn(S) = \frac{Vup(S) - Vdn(S)}{R}. \quad (20)$$

Yup can be expressed by using Ydn as follows:

$$Yup(S) = \frac{Ydn(S)}{1 + R \times Ydn(S)} \quad (21)$$
$$= Ydn(S) - R \times Ydn(S)^2 + R^2 \times Ydn(S)^3 -$$
$$R^3 \times Ydn(S)^4 + R^4 + Ydn(S)^5 - R^5 \times Ydn(S)^6.$$

When the above equation (21) is expressed based on the coefficient "S", the following can be obtained.

Yup1=Ydn1,

Yup2=Ydn2−R×Ydn1²,

Yup3=Ydn3−2×R×Ydn1×Ydn2+R²×Ydn1³,

Yup4=Ydn4−2×R×Ydn1×Ydn3−R×Ydn2²+3×R²×Ydn1²×Ydn2−R³×Ydn1⁴,

Yup5=Ydn5−2×R×Ydn1×Ydn4−2×R×Ydn2×Ydn3+3×R²×Ydn1²×Ydn3 +3×R²×Ydn1×Ydn2²−4×R³×Ydn1³×Ydn2+R⁴×Ydn1⁵, and Yup6=Ydn6−2×R×Ydn1×Ydn5−2×R×Ydn2×Ydn4−3×R²×Ydn1²×Ydn4−R×Ydn3² +6×R²×Ydn1Ydn2×Ydn3−4×R³×Ydn1³×Ydn3+ R²×Ydn2³−6×R³×Ydn1²×Ydn2²+5 ×R⁴×Ydn1⁴×Ydn2−R⁵×Ydn1⁶. (22)

(R5) MERGE RULE

Figure 10:
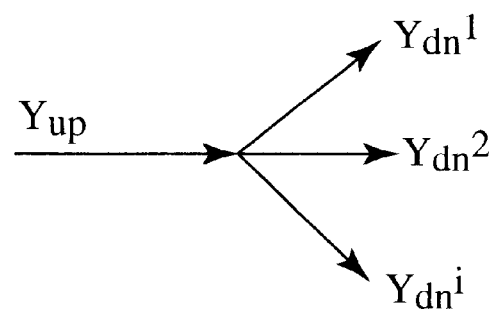
FIG. 10 is a diagram showing a branch in an admittance calculation of wiring.

In FIG. 10, Yup designates an admittance of the point that is close to the output pin for driving through the branch point. $Ydn^i$ designates an admittance of the point that is close to the input pin through the branch point. The following equations can be obtained because the current is constant.

$$Yup1 = \sum_i Ydn1^i, \quad (23)$$

$$Yup2 = \sum_i Ydn2^i,$$

$$Yup3 = \sum_i Ydn3^i,$$

$$Yup4 = \sum_i Ydn4^i,$$

-continued $$Yup5 = \sum_i Ydn5^i, \text{ and}$$

$$Yup6 = \sum_i Ydn6^i.$$

Figure 11:
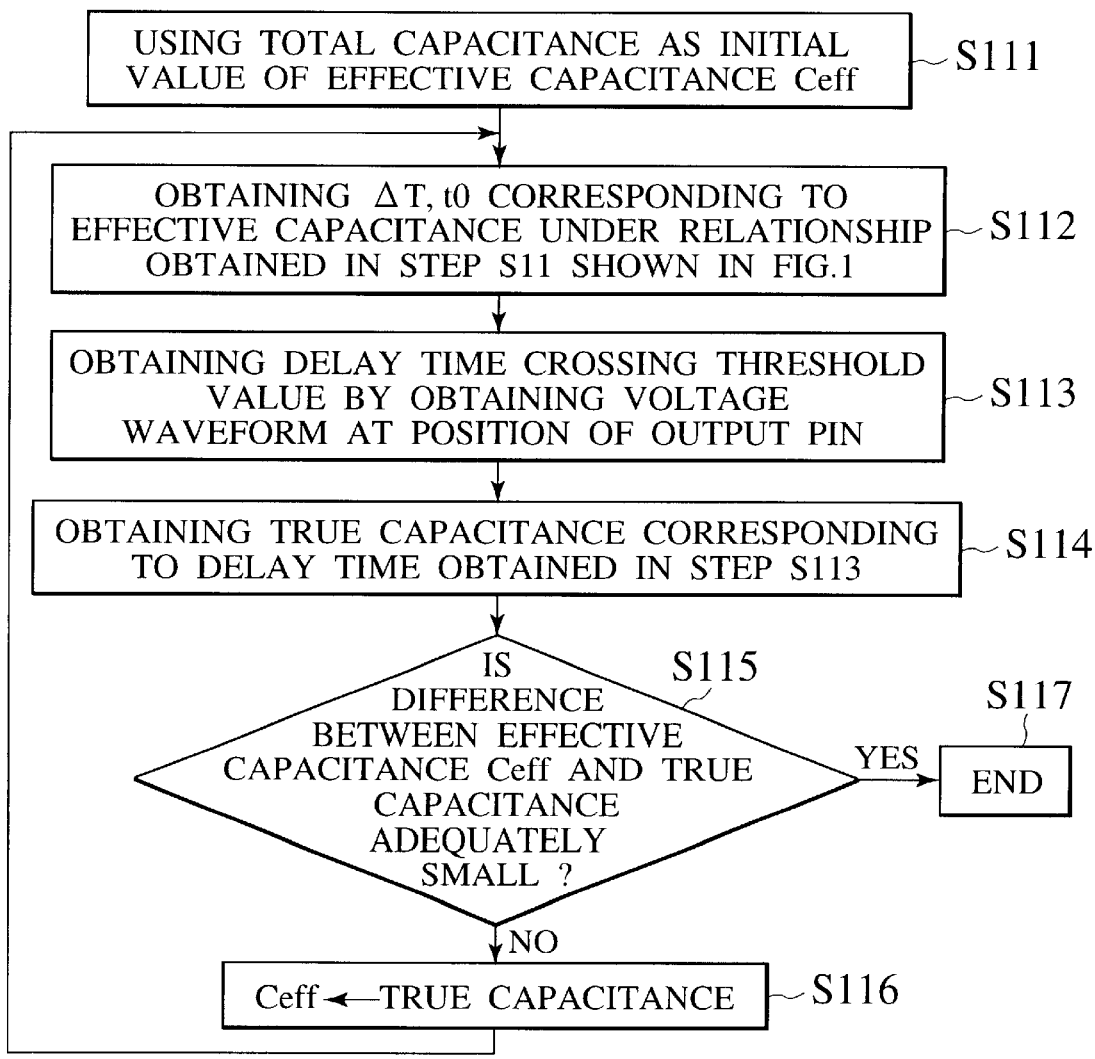
FIG. 11 is a flowchart showing the procedure to calculate an effective capacitance and a delay value at a position of an output pin.

The rough procedure of the calculation for an effective capacitance and a delay time at the output pin in Step S13 shown in FIG. 1 becomes the operation flow shown in FIG. 11.

If the effective capacitance and the delay values do not converge based on the processes shown in FIG. 11, the effective capacitance Ceff can be obtained based on a bisection method in which zero is the lower limit and the total capacitance is the upper limit.

In Step S111 of FIG. 11, the total capacitance of the wiring is set as the initial value of the effective capacitance.

The total capacitance is calculated as a coefficient of first order of S in the calculation shown in Step S12 of FIG. 1. In Step S112 of FIG. 11, the values ΔT and t0 are calculated based on the effective capacitance. These values ΔT and t0 are calculated in Step S11 of FIG. 1. ΔT and t0 are functions of transition time of the input signal and the load capacitance. Because the transition time of the input signal has been calculated, both the values ΔT and t0 can be calculated by using the effective capacitance as the load capacitance. In Step S113, the waveform at the position of the output pin is obtained and the delay time that crosses the threshold value is obtained.

In order to calculate the waveform at the output pin, the following method is used.

Figure 12:
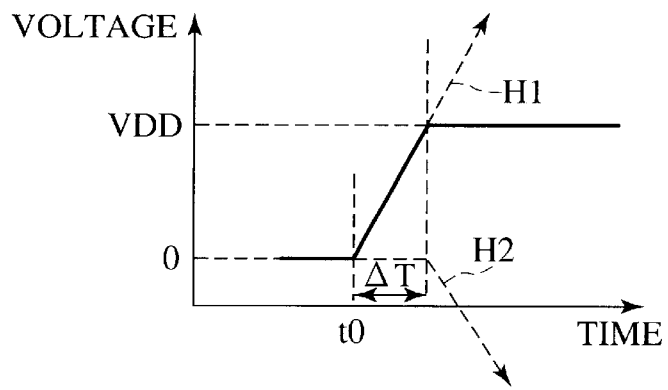
FIG. 12 is a diagram showing an example of a decomposition of a voltage waveform.
Figure 16:
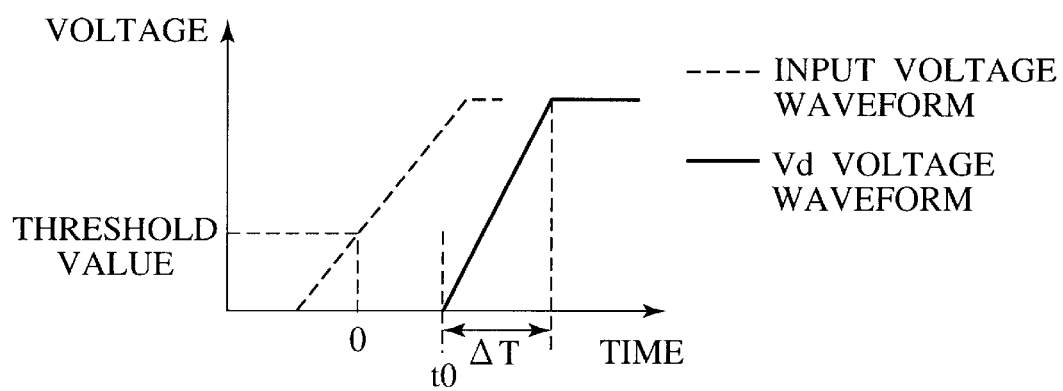
FIG. 16 is a diagram showing an example of voltage waveforms in the model shown in FIG. 15.

It is assumed in FIG. 12 that the waveform of the voltage Vd shown in FIG. 16 is obtained by subtracting the ramp waveform (H2) that decreases infinitely from the ramp waveform (H1) that increases infinitely.

After AWE regarding the infinite ramp waveform is calculated and AWE is converted to the real-time waveform, and in order to obtain a final waveform, the real-time waveform is subtracted from a waveform that is shifted in time.

The above-calculation can be expressed as follows:

$$Vd = Vd\infty(t-t0) - Vd\infty(t-t0-\Delta T),$$

$$Vd^\infty(t) = (VDD/\Delta T) \times t \times U(t),$$

$$U(t) = 0$$

(t<0), and $$U(t) = 1$$

(t≥Δ0). (24)

Hereinafter, "Vd∞" designates the ramp waveform that increases infinitely, Vdrive is the voltage waveform at the position of the output pin, and the calculation is executed based on the value of t0=0 for calculation brevity, and the calculation result is corrected later. Because the current is constant, the following equations can be obtained:

$$\frac{Vd\infty - Vdrive}{Rd} = Y \times Vdrive \quad (25)$$

$$\Rightarrow$$

$$Vdrive = \frac{Vd\infty}{1 + Rd \times Y},$$

-continued $$Vd\infty = \frac{VDD}{\Delta T} \times t \quad (t >= 0)$$
$$= 0 \quad (t <= 0),$$

$$Vd\infty(S) = \frac{VDD}{\Delta T} \times \frac{1}{S^2},$$

$$Vdrive(S) = m_{-2} \times S^{-2} + m_{-1} \times S^{-1} + m_0 + m_1 \times S + m_2 \times S^2 + m_3 \times S^3 + m_4 \times S^4 + O(S^5),$$

$$Y = Y1 \times S + Y2 \times \times S^2 + Y3 \times S^3 + Y4 \times S^4 + Y5 \times S^5 + Y6 \times S^6 + O(S^7)$$

Therefore, the following coefficients $m_{-2}$, $m_{-1}$, $m_0$, $m_1$, $m_2$, $m_3$, and $m_4$ can be obtained.

$$m_{-2} = \frac{VDD}{\Delta T}, \tag{26}$$

$$m_{-1} = \frac{-VDD \times Rd \times Y1}{\Delta T},$$

$$m_0 = \frac{VDD \times (-Rd \times Y2 + Rd^2 \times Y1^2)}{\Delta T},$$

$$m_1 = \frac{VDD \times (-Rd \times Y3 + Rd^2 \times (2 \times Y1 \times Y2) - Rd^3 \times Y1^3)}{\Delta T},$$

$$m_2 = \frac{VDD}{\Delta T} \times ((-Rd \times Y4 + Rd^2 \times (2 \times Y1 \times Y3 + Y2^2) - Rd^3 \times (3 \times Y1^2 \times Y2) + Rd^4 \times Y1^4)),$$

$$m_3 = \frac{VDD}{\Delta T} \times ((-Rd \times Y5) + Rd^2 \times (2 \times Y1 \times Y4 + 2 \times Y2 \times Y3) - Rd^3 \times (3 \times Y1^2 \times Y3 + 3 \times Y1 \times Y2^2) + Rd^4 \times (4 \times Y1^3 \times Y2) - Rd^5 \times Y1^5),$$

$$m_4 = \frac{VDD}{\Delta T} \times ((-Rd \times Y6) + Rd^2 \times (2 \times Y1 \times Y5 + 2 \times Y2 \times Y4 + Y3^2) - Rd^3 \times (3 \times Y1^2 \times Y4 + 6 \times Y1 \times Y2 \times Y3) + Rd^4 \times (4 \times Y1^3 \times Y3 + 6 \times Y1^2 \times Y2^2) - Rd^5 \times (5 \times Y1^4 \times Y2) + Rd^6 \times Y1^6)$$

By using the coefficients obtained, AWE calculates the waveform as follows:

In AWE of first order, $$m_{-1} \times -a = m_0, \tag{27}$$
$$a \times p + 1 = 0,$$
$$-k = m_{-1}$$
$$\Rightarrow$$
$$p = \frac{-1}{a} = \frac{m_{-1}}{m_0},$$
$$k = m_{-1}.$$

Accordingly, the voltage waveform corresponding to the ramp waveform that increases infinitely becomes as follows:

$$Vd\infty = \frac{VDD \times t}{\Delta t} + m_{-1} - m_{-1} \times \exp\left[\frac{m_{-1} \times t}{m_0}\right]. \tag{28}$$

In AWE of second order, in order to obtain a0 and a1 the following equation is solved.

$$\begin{bmatrix} m_{-1} & m_0 \\ m_0 & m_1 \end{bmatrix} \begin{bmatrix} -a_0 \\ -a_1 \end{bmatrix} = \begin{bmatrix} m_1 \\ m_2 \end{bmatrix}. \tag{29}$$

Both a0 and a1 become real numbers because each value in the equation (29) is a real number.

$$a0 \times p^2 + a1 \times p + 1 = 0. \tag{30}$$

The solutions of the equation (30) are p1 and p2 that are real numbers or complex numbers.

In order to obtain k1 and k2, the following equation (31) is solved.

$$\begin{bmatrix} 1 & 1 \\ \frac{1}{p1} & \frac{1}{p2} \end{bmatrix} \begin{bmatrix} -k1 \\ -k2 \end{bmatrix} = \begin{bmatrix} m_{-1} \\ m_0 \end{bmatrix}. \tag{31}$$

Both k1 and k2 are real numbers or complex numbers.

The following is the voltage waveform corresponding to the ramp waveform that increases infinitely.

$$Vd\infty = \frac{VDD \times t}{\Delta T} + m_{-1} + k1 \times \exp(p1 \times t) + k2 \times \exp(p2 \times t). \tag{32}$$

AWE of three order is as follows:

$$\begin{bmatrix} m_{-1} & m_0 & m_1 \\ m_0 & m_1 & m_2 \\ m_1 & m_2 & m_3 \end{bmatrix} \begin{bmatrix} -a0 \\ -a1 \\ -a2 \end{bmatrix} = \begin{bmatrix} m_2 \\ m_3 \\ m_4 \end{bmatrix}. \tag{33}$$

The solutions of the equation (33) are a0, a1, and a2, a0, a1, and a2 become real numbers because each value in the equation is a real number. The equation (34) is solved by using these values a0, a1, and a2.

$$a0 \times p^3 + a1 \times p^2 30\ a2 \times p + 1 = 0. \tag{34}$$

The solutions of the equation (34) are p1, p2, and p3. These solutions p1, p2, and p3 are real numbers or complex numbers.

Next, the following equation (35) is solved.

$$\begin{bmatrix} 1 & 1 & 1 \\ \frac{1}{p1} & \frac{1}{p2} & \frac{1}{p3} \\ \frac{1}{p1^2} & \frac{1}{p2^2} & \frac{1}{p3^2} \end{bmatrix} \begin{bmatrix} -k1 \\ -k2 \\ -k3 \end{bmatrix} = \begin{bmatrix} m_{-1} \\ m_0 \\ m_1 \end{bmatrix}. \tag{35}$$

The solutions of the equation (35) are k1, k2, and k3. These k1, k2, and k3 are real numbers or complex numbers.

Accordingly, the voltage waveform corresponding to the ramp waveform that increases infinitely is as follows:

$$Vd\infty = \frac{VDD \times t}{\Delta T} + m_{-1} + k1 \times \exp(p1 \times t) + k2 \times \exp(p2 \times t) + k3 \times \exp(p3 \times t). \tag{36}$$

The final waveform becomes the following equation (37) in consideration of the value t0.

$$Vdrive(t) = Vd\infty(t - t0) \times U(t - t0) - \qquad (37)$$

$$Vd\infty(t - \Delta T - t0) \times U(t - \Delta T - t0)$$

where U(t) is a step function in which the value is switched from zero to 1 (0→1) at the time 0.

Figure 13:
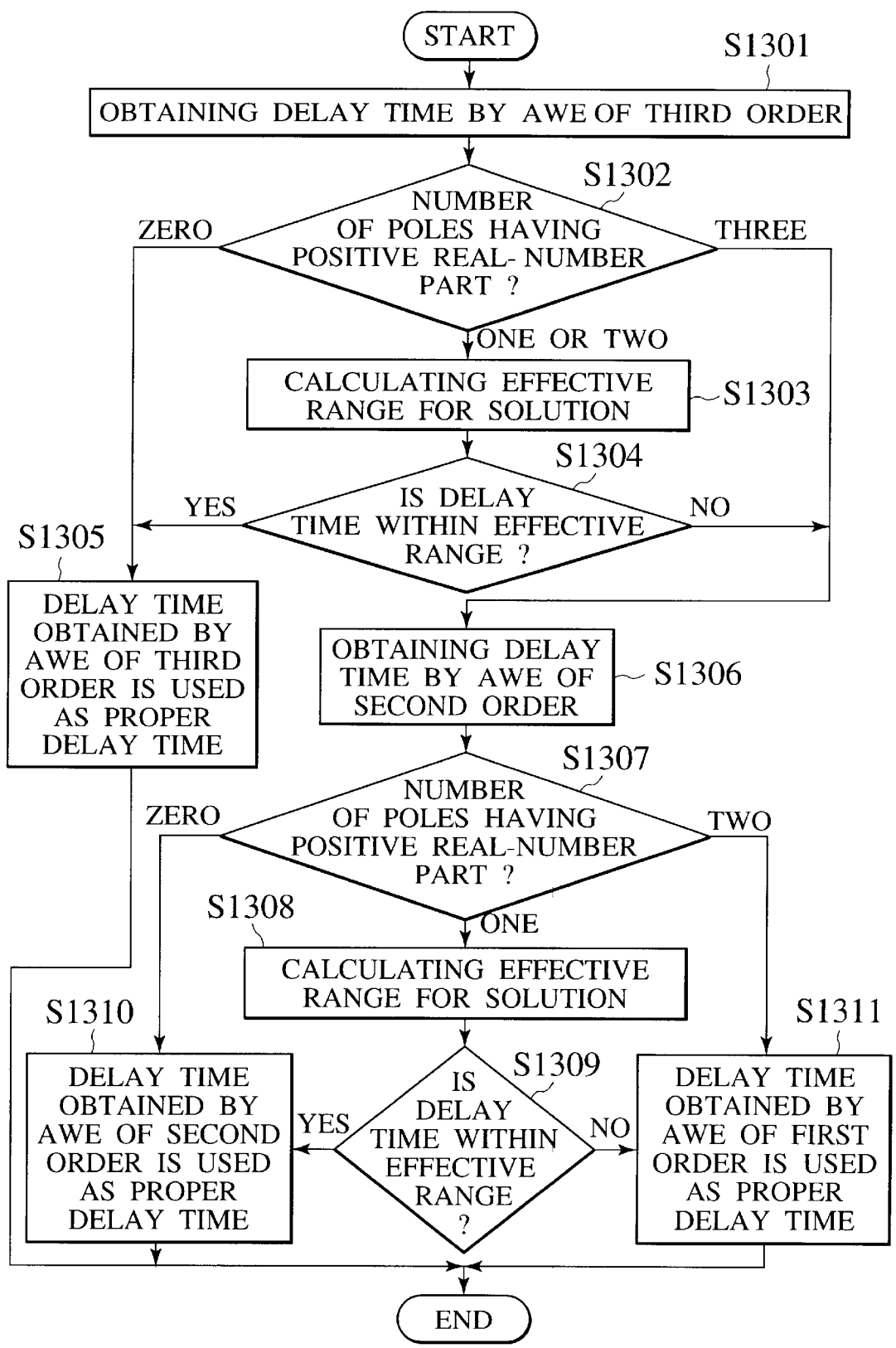
FIG. 13 is a flowchart showing the procedure of a calculation to obtain a signal delay time.
Figure 14:
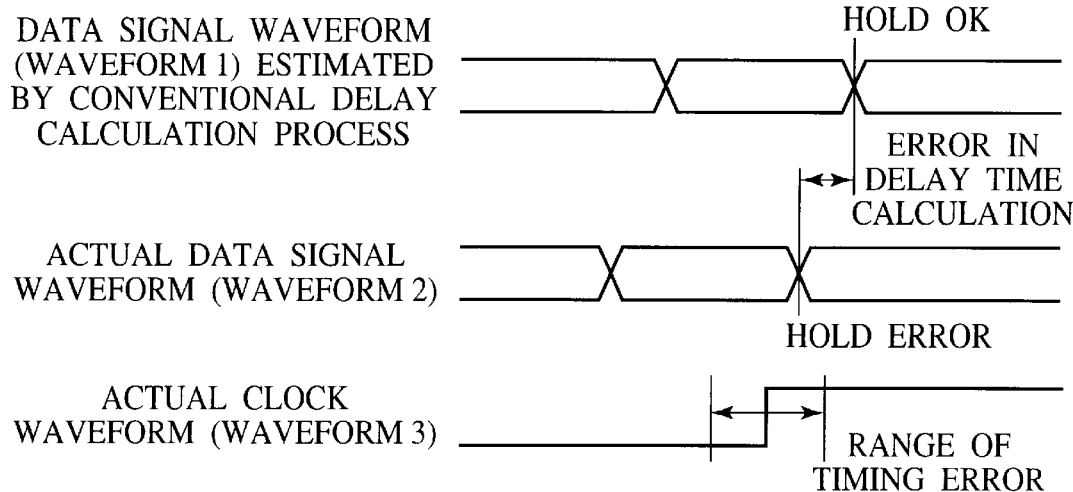
FIG. 14 is a diagram showing an example of a timing error.

Next, as shown in the calculation flow of the delay time shown in FIG. 13, the equation Vdrive (t)=Vth is solved in order to obtain the delay time. In Step S1301 of FIG. 13, AWE of three-order is solved. In Step S1302, the operation flows proceeds to Step S1305 only when there is no pole having a positive real-part obtained in the calculation of Step S1301. On the other hand, when there are one or two poles having a positive real-part obtained in Step S1301, the operation flow proceeds to Step S1303. When there are three poles having a positive real part, the operation flow proceeds to Step S1306.

In Step S1303, an effective range of the solution is obtained as follows:

When there is one pole (p1) having a positive real-part and two poles (p2 and p3) having a negative real-part in AWE of three-order, because p1, p2, and p3 are solutions of an equation of three degrees for real coefficients a0, a1, and a2 included in the equation (34), one pole of a positive real-number and two poles of a negative real-number, or one pole of a positive real-number and two poles having a negative real-number part (as a pair of complex number) can be obtained as solutions.

When there are one pole (p1) of a positive real number and two poles (p2 and p3) of a negative real number, the following equation (38) can be obtained.

$$|k2 \times \exp(p2 \times tmax1) + k3 \times \exp(p3 \times tmax1)| = \qquad (38)$$

$$|k1 \times \exp(p1 \times tmax1)|$$

When "tmax1" satisfying the equation (38) is determined, it can be said that the real part has a weak effect of the positive pole when t<tmax1. Because the equation (39) is expressed as follows.

$$|k2 \times \exp(p2 \times t) + k3 \times \exp(p3 \times t)| \geq \qquad (39)$$

$$2 \times sqrt(|k2 \times k3|) \times \exp\left[\frac{(p2 + p3) \times t}{2}\right].$$

$$2 \times sqrt(|k2 \times k3|) \times \exp\left[\frac{(p2 + p3) \times tmax2}{2}\right] = |k1| \times \exp(p1 \times tmax2). \qquad (40)$$

The term "tmax2" can be expressed as follows because of equations (39) and (40):

$$tmax2 = \frac{2 \times \ln\left[\frac{2 \times sqrt(|k2 \times k3|)}{|k1|}\right]}{2 \times p1 - p2 - p3} \leq tmax1. \qquad (41)$$

When "tmax2" is greater than zero (tmax2>0), the correct range of the delay time becomes 0<t<tmax2/<const>. For example, when the value <const> is 5, the term having the pole having a positive real-number part becomes exp(−5) or less.

Under a case that there are one pole of a positive real-number, two poles (as a pair of complex number) having a negative real-number part, when the pole of a positive real-number is "p1" and the poles having a negative real-number part are "p2" and "p3", the following equation (42) is obtained.

$$|k2 \times \exp(p2 \times tmax1) + k3 \times \exp(p3 \times tmax1)| = \qquad (42)$$

$$|k1 \times \exp(p1 \times tmax1)|.$$

When the term "tmax1" in the equation (42) is obtained, it may be said that the real part has a weak effect of the positive pole.

$$|k2 \times \exp(p2 \times t) + k3 \times \exp(p3 \times t)| \geq \qquad (43)$$

$$2 \times sqrt(|k2 \times k3|) \times \exp\left[\frac{(p2 + p3) \times t}{2}\right].$$

$$2 \times sqrt(|k2 \times k3|) \times \exp\left[\frac{(p2 + p3) \times tmax2}{2}\right] = \qquad (44)$$

$$|k1| \times \exp(p1 \times tmax2).$$

$$tmax2 = \frac{2 \times \ln\left[\frac{2 \times sqrt(|k2 \times k3|)}{|k1|}\right]}{2 \times p1 - p2 - p3} \leq tmax1. \qquad (45)$$

When tmax2 is greater than zero (tmax2>0), "0<t<tmax2/<const>" becomes a correct range of the delay time.

When there are two poles (p1, p2) having a positive real-number part and one pole (p3) having a negative real-number part in AWE of three-order, because these values p1, p2, and p3 become the solutions of an equation of three degrees for real coefficients a0, a1, a2. Therefore the pole p3 is a negative real-number and both p1 and p2 become a pair of complex number having a positive real part, or p3 is a negative real-number part and both p1 and p2 are positive real-numbers.

When the pole p3 is a negative real number and both the poles p1 and p2 are positive real-numbers (p1>=p2>0>p3), the following tmax1 satisfying the equation (46) is obtained, it is said that the effect of the pole of a positive real-number is weak.

$$|k1 \times \exp(p1 \times tmax1) + k2 \times \exp(p2 \times tmax1)| = \qquad (46)$$

$$|k3 \times \exp(p3 \times tmax1)|.$$

$$|k1 \times \exp(p1 \times t) + k2 \times \exp(p2 \times t)| \leq \qquad (47)$$

$$|k1| \times \exp(p1 \times t) + |k2| \times \exp(p2 \times t) \leq (|k1| + |k2|) \times \exp(p1 \times t).$$

$$|k3 \times \exp(p3 \times tmax2)| = (|k1| + |k2|) \times \exp(p1 \times tmax2). \qquad (48)$$

Therefore tmax2 can be obtained as follows because of relationships (47) and (48).

$$tmax2 = \frac{\ln\left[\frac{|k3|}{|k1| + |k2|}\right]}{p1 - p3} \leq tmax1. \qquad (49)$$

When tmax2 is greater than zero (tmax2>0), 0<t<tmax2/<const> becomes the correct range of the delay time. When the pole p3 is a negative real number and the poles p1 and p2 are a pair of complex number whose real-number part is a positive value, and if "tmax1" in the following equation (50) is determined, it is said that the effect of the poles having the positive real part is weak.

$$|k1 \times \exp(p1 \times tmax1) + k2 \times \exp(p2 \times tmax1)| = \quad (50)$$
$$|k3 \times \exp(p3 \times tmax1)|$$

Because $|k1|=|k2|$, $\text{Real}(p1)=\text{Real}(p2)$, $$|k1 \times \exp(p1 \times t) + k2 \times \exp(p2 \times t)| \leq 2 \times |k1| \times \exp(\text{Real}(p1) \times t). \quad (51)$$

$$|k3 \times \exp(p3 \times tmax2)| = 2 \times |k1| \times \exp(\text{Real}(p1) \times tmax2). \quad (52)$$

Therefore, tmax2 can be obtained as follows because of equations (50), (51), and (52):

$$tmax2 = \frac{\ln\left[\frac{|k3|}{2 \times |k2|}\right]}{\text{Real}(p1) - p3} \leq tmax1. \quad (53)$$

When tmax2 is greater than zero (tmax2>0), the correct range of the delay time becomes 0<t<tmax2/<Const>.

In Step S1304 of FIG. 13, when the delay time is within the range calculated at Step S1303, the operation flow proceeds to Step S1305. If not within the range, the operation flow proceeds to Step S1306.

In Step S1305, it is assumed that the delay time obtained from the third order AWE is a correct delay time, and the calculation is then terminated.

In Step S1306, the delay time is obtained by using second order AWE. In Step S1307, when there is no pole (that has been obtained) having a positive real part, the operation flows proceeds to Step S1310. When there is one pole having a positive real part, the operation flow proceeds to Step S1308. When there are two poles having a positive real part, the operation flow proceeds to Step S1311.

When there is one pole (p1) having a positive real part and one pole (p2) having a negative real part in Step S1308, p1 and p2 become solutions of the following second order equation (54) having real coefficients a0 and a1.

$$a0 \times p^2 + a1 \times p + 1 = 0, \quad (54)$$

where p1 is a positive real number, p2 is a negative real number, and, k1 and k2 are real numbers.

$$|k1 \times \exp(p1 \times tmax)| = |k2 \times \exp(p2 \times tmax)| \quad (55)$$
$$\Rightarrow$$
$$|k1| \times \exp(p1 \times tmax) = |k2| \times \exp(p2 \times tmax)$$
$$\Rightarrow$$
$$tmax = \frac{\ln\left[\frac{|k2|}{|k1|}\right]}{p1 - p2}.$$

When "tmax" is greater than zero (tmax>0), 0<t<tmax/<Const> is the correct range of the delay time. For example, the term of the pole of the positive real number gives only the value "exp(−5)" or less to the waveform obtained when <Const>=5.

In general, because the signal waveform does not diverge, the real-number part of the pole (corresponding to "Pi") does not take a positive value. However, because the approximation calculation is performed in n-th degree of S, there is a possibility to obtain a pole having a positive number of the real part. It is considered that terms in n-th or more orders that are neglected include smaller terms than Pi because the terms of a smaller Pi affect the parts of larger orders of S. A smaller Pi indicates the term having a slower change of the waveform. Accordingly, when it is necessary to obtain the delay time of which the waveform is over the threshold value, even if the pole having a positive real part is calculated, it is possible to calculate the delay time with high accuracy.

When the delay time obtained in Step S1309 is within the range obtained in Step S1308, the operation flow proceeds to Step S1310. If not within the range, the operation flow proceeds to Step S1311.

In Step S1310, the delay time is obtained in second order AWE and the calculation is terminated. In Step S1311, the delay time of first order AWE and the calculation is completed.

Next, a description will be given of the calculation for the voltage waveform at the position of the input pin shown in Step S14 shown in FIG. 1.

In Step S13 shown in FIG. 1, the coefficients to n-th order of S performed by Laplace transform at the position of the output pin have been obtained. Thereby, the coefficients of Laplace transform for the voltage waveform at the position of the input pin can be obtained as following processes (A-1) to (A-4).

(A-1) Calculation is executed from Output pin side to Input pin side.

(A-2) Because of the same voltage, C (Capacitance) RULE is as follows:

$$Vdn = Vup. \quad (56)$$

(A-3) $R$ RULE $$Yup \times Vup = \frac{Vup - Vdn}{R} \quad (57)$$
$$\Rightarrow$$
$$Vdn = (1 - R \times Yup) \times Vup,$$
$$Vup = Vup_{-2} \times S^{-2} + Vup_{-1} \times S^{-1} + Vup_0 + Vup_1 \times$$
$$S + Vup_2 \times S^2 + Vup_3 \times S^3 + Vup_4 \times S^4 + O(S^5),$$
$$Yup = Yup_1 \times S + Yup_2 \times S^2 + Yup_3 \times S^3 + Yup_4 \times$$
$$S^4 + Yup_5 \times S^5 + Yup_6 \times S^6 + O(S^7),$$
$$Vdn = Vdn_{-2} \times S^{-2} + Vdn_{-1} \times S^{-1} + Vdn_0 + Vdn_1 \times S +$$
$$Vdn_2 \times S^2 + Vdn_3 \times S^3 + Vdn_4 \times S^4 + O(S^5).$$

The following is values regarding Vdn of various orders of S.

$$Vdn_{-2} = Vup_{-2},$$

$$Vdn_{-1} = Vup_{-1} - R \times Yup_1 \times Vup_{-2},$$

$$Vdn_0 = Vup_0 - R \times Yup_2 \times Vup_{-2} - R \times Yup_1 \times Vup_{-1},$$

$$Vdn_1 = Vup_1 - R \times Yup_3 \times Vup_{-2} - R \times Yup_2 \times Vup_{-1} - R \times Yup_1 \times Vup_0,$$

$$Vdn_2 = Vup_2 - R \times Yup_4 \times VUp_{-2} - R \times Yup_3 \times Vup_{-1} - R \times Yup_2 \times Vup_0, -R \times Yup_1 \times Vup_1,$$

$$Vdn_3 = Vup_3 - R \times Yup_5 \times Vup_{-2} - R \times Yup_4 \times Vup_{-1} - R \times Yup_3 \times Vup_0 -R \times Yup_2 \times Vup_1 - R \times Yup_1 \times Vup_2,$$

$$Vdn_4 = Vup_4 - R \times Yup_6 \times Vup_{-2} - R \times Yup_5 \times Vup_{-1} - R \times Yup_4 \times Vup_0 -R \times Yup_3 \times Vup_1 - R \times Yup_2 \times Vup_2 - R \times Yup_1 \times Vup_3. \quad (58)$$

(A-4) BRANCH RULE

It is not necessary to consider variance. In order to obtain the delay time at the position of the input pin, the following values Vd are used like Step S113 shown in FIG. 11.

$m_{-2} = Vdn_{-2}$,
$m_{-1} = Vdn_{-1}$,
$m_0 = Vdn_0$,
$m_1 = Vdn_1$,
$m_2 = Vdn_2$,
$m_3 = Vdn_3$, and
$m_4 = Vdn_4$.

Thus, according to the embodiment described above, even if the real part of a pole is a positive value in the signal delay calculation method using AWE, there is a case in which it is possible to use the pole to perform the delay time with high preciousness. Therefore it is not necessary to repeat the calculation of the delay time in various orders, because it is possible to obtain the delay time with high preciousness when the result of the delay time is within the range obtained by calculating the correct range for the delay time to be used with high preciousness. In addition to the above feature, it is possible to reduce the total calculation time.

The signal delay time calculation method using AWE can calculate the characteristics of the cell with high accuracy by using the existing function of the delay time of the cell in which the transition time of the output signal at the output pin and the load capacitance of the output pin are variables, and the existing function of the transition time of the output signal in which the input signal transition time and the load capacitance of the output pin are variables. Thereby, it is not necessary to measure the characteristics of the cell repeatedly when the parameters of a cell model are required.

A computer program product for executing the signal delay time calculation method described above by a computer system can be stored in a recording medium. After the computer system reads this computer program product stored in the recording medium, it is possible to realize the signal delay time calculation method by executing the program. In this case, the recording medium includes a memory device, a magnetic disk device, an optical disc device, a device for storing the program and readable by a computer system. The hardware to realize this signal delay time calculation method is constructed by a normal computer system comprising a CPU as a control core performing various processing to execute the program, an input device such as a keyboard, a mouse, a light pen, and a flexible disc device, an external memory device such as a memory device, a disk device and the like, and an output device such as a display device, a printer, and the like. The CPU comprises an arithmetic section for performing the processing of a computer language to describe each processing, and a main memory section for storing instructions for each processing.

As set forth in detail, in the signal delay time calculation method using AWE according to the present invention, even if the real part in poles are positive values, there is a possibility to use it for the calculation of the delay time with high accuracy. In this case, it is not necessary to calculate the delay time again by changing orders because it can be recognized to calculate the delay time accurately only when the calculation result is within this range. Thereby, it is possible to calculate the signal delay time in a cell in an LSI with high accuracy.

In addition, in the signal delay time calculation method using AWE, it is possible to calculate the signal delay time with high accuracy based on the function of the delay time in the cell in which the input signal transition time and the load capacitance of the output pin in the existing cell are variables, and the function of the transition time of the output signal in which the input signal transition time and the load capacitance of the output pin are variables. It is not therefore necessary to measure the characteristics of the cell again when the parameters of the cell in model are obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal delay time calculation method based on Asymptotic Waveform Evaluation (AWE) of calculating an approximate signal delay time in a semiconductor integrated circuit (LSI) by calculating a voltage waveform of a signal by using terms of an admittance up to n-th order obtained by performing Laplace transform for the LSI, the signal delay time calculation method comprising:
first step of calculating an admittance of the LSI by performing Laplace transform;
second step of calculating a first voltage waveform obtained by Laplace transform of a power source voltage for driving the admittance obtained by Laplace transform in the first step;
third step of calculating a second voltage waveform obtained by Laplace transform of a voltage at an optional point in the LSI based on the admittance obtained in the first step and the first voltage waveform obtained in the second step;
fourth step of calculating a real-time approximate voltage waveform of the second voltage waveform by obtaining poles and residues of the second voltage waveform;
fifth step of calculating a signal delay time in the LSI based on the real-time voltage waveform obtained in the fourth step; and
sixth step of judging whether the signal delay time obtained in the fifth step is within an acceptable precision range when one or more poles obtained in the fourth step include a real-number part of more than zero.

2. The signal delay calculation method according to claim 1, wherein in the second step, an approximate power source voltage having parameters an internal resistance, a voltage change initiation time, and a voltage transition time is used as the power source voltage.

3. A signal delay time calculation method based on Asymptotic Waveform Evaluation (AWE) of calculating an approximate signal delay time in a semiconductor integrated circuit (LSI) by calculating a voltage waveform of a signal by using terms of an admittance up to n-th order obtained by performing Laplace transform for the LSI after an output terminal of a cell in the LSI is modeled by using a power source voltage in a ramp waveform and an internal resistance of the cell in which an output signal change initiation time and an output signal transition time at the output terminal are used as parameters based on following two functions, a function of a signal delay time at the output terminal of the cell in the LSI using variables of an input signal transition time and a load capacitance of the output terminal of the cell as functional elements in the LSI, and a function of the output signal transition time at the output terminal using variables of the input signal transition time and the load capacitance of the output terminal of the cell, the signal delay time calculation method comprising:

first step of calculating an internal resistance;

second step of calculating the output signal change initiation time and the output signal transition time by using a linear function of time for the output signal change at the output terminal by using the internal resistance obtained in the first step as a fixed value; and third step of calculating the output signal change initiation time by fixing the internal resistance obtained in the first step and the output signal transition time obtained in the second step and by changing only the output signal change initiation time.

4. The signal delay calculation method according to claim 3, wherein in the first step, the internal resistance is calculated based on a function of the output signal transition time using variables of the load capacitance of the output terminal and the input signal transition time.

5. A signal delay time calculation method based on Asymptotic Waveform Evaluation (AWE) of calculating an approximate signal delay time in a semiconductor integrated circuit (LSI) by calculating a voltage waveform of a signal by using terms of an admittance up to n-th order obtained by performing Laplace transform for the LSI after an output terminal of a cell in the LSI is modeled by using a power source voltage in a ramp waveform and an internal resistance of the cell in which an output signal change initiation time and an output signal transition time at the output terminal are used as parameters based on following two functions, a function of a signal delay time at the output terminal of the cell in the LSI using variables of an input signal transition time and a load capacitance of the output terminal of the cell as functional elements in the LSI, and a function of the output signal transition time at the output terminal using variables of the input signal transition time and the load capacitance of the output terminal of the cell, the signal delay time calculation method comprising:

first step of calculating an admittance of the LSI by performing Laplace transform;

first step of calculating an internal resistance;

second step of calculating an internal resistance of the output terminal based on a function of the output signal transition time using variables of the load capacitance of the output terminal and the input signal transition time;

third step of calculating the output signal change initiation time and the output signal transition time by using a linear function of time for the output signal change at the output terminal by using the internal resistance obtained in the second step as a fixed value;

fourth step of calculating, in order to have a model of the output terminal in the cell, the output signal change initiation time by fixing the internal resistance obtained in the second step and the output signal transition time obtained in the third step and by changing only the output signal change initiation time;

fifth step of calculating a first voltage waveform obtained by Laplace transform by using a power source voltage having the internal resistance obtained in the second step, the output signal change initiation time obtained in the fourth step, and the output signal transition time obtained in the third step;

sixth step of calculating a second voltage waveform obtained by Laplace transform of an optional position in the LSI by using the admittance obtained in the first step, the internal resistance obtained in the second step, and the first voltage waveform obtained in the fifth step;

seventh step of calculating a real-time approximate voltage residues of the second voltage waveform by obtaining poles and residues of the second voltage waveform;

eighth step oxcdf calculating a signal delay time in the LSI based on the real-time voltage waveform obtained in the seventh step; and ninth step of judging whether the signal delay time obtained in the eighth step is within an acceptable precision range when one or more poles obtained in the seventh step include a real-number part of more than zero.

6. The signal delay calculation method according to claim 1, wherein the signal delay time obtained is selected when it is judged that the signal delay time obtained in the sixth step is within the acceptable precision range, and wherein the signal delay time obtained is not selected when it is judged that the signal delay time obtained in the sixth step is not within the acceptable precision range, and further performing the calculation step for the approximate signal delay time by using terms of the admittance of more or less than n-th order.

7. The signal delay calculation method according to claim 5, wherein the signal delay time obtained is selected when it is judged that the signal delay time obtained in the sixth step is within the acceptable precision range, and wherein the signal delay time obtained is not selected when it is judged that the signal delay time obtained in the sixth step is not within the acceptable precision range, and further performing the calculation step for the approximate signal delay time by using terms of the admittance of more or less than n-th order.

8. A computer program product including instructions for executing, by a computer system, a signal delay time calculation method based on Asymptotic Waveform Evaluation (AWE) of calculating an approximate signal delay time in a semiconductor integrated circuit (LSI) by calculating a voltage waveform of a signal by using terms of an admittance up to n-th order obtained by performing Laplace transform for the LSI, which comprising:

first step of calculating an admittance of the LSI by performing Laplace transform;

second step of calculating a first voltage waveform obtained by Laplace transform of a power source voltage for driving the admittance obtained by Laplace transform in the first step;

third step of calculating a second voltage waveform obtained by Laplace transform of a voltage at an optional point in the LSI based on the admittance obtained in the first step and the first voltage waveform obtained in the second step;

fourth step of calculating a real-time approximate voltage waveform of the second voltage waveform by obtaining poles and residues of the second voltage waveform;

fifth step of calculating a signal delay time in the LSI based on the real-time voltage waveform obtained in the fourth step; and sixth step of judging whether the signal delay time obtained in the fifth step is within an acceptable precision range when one or more poles obtained in the fourth step include a real-number part of more than zero.

9. A computer program product including instructions for executing, by a computer system, a signal delay time calculation method based on Asymptotic Waveform Evaluation (AWE) of calculating an approximate signal delay time in a semiconductor integrated circuit (LSI) by calculating a voltage waveform of a signal by using terms of an admittance up to n-th order obtained by performing Laplace transform for the LSI after an output terminal of a cell in the LSI is modeled by using a power source voltage in a ramp waveform and an internal resistance of the cell in which an output signal change initiation time and an output signal transition time at the output terminal are used as parameters based on following two functions, a function of a signal delay time at the output terminal of the cell in the LSI using variables of an input signal transition time and a load capacitance of the output terminal of the cell which is a functional element in the LSI, and a function of the output signal transition time at the output terminal using variables of the input signal transition time and the load capacitance of the output terminal of the cell, which comprising:

first step of calculating an internal resistance;

second step of calculating the output signal change initiation time and the output signal transition time by using a linear function of time for the output signal change at the output terminal by using the internal resistance obtained in the first step as a fixed value; and third step of calculating the output signal change initiation time by fixing the internal resistance obtained in the first step and the output signal transition time obtained in the second step and by changing only the output signal change initiation time.

10. A computer program product including instructions for executing, by a computer system, a signal delay time calculation method based on Asymptotic Waveform Evaluation (AWE) of calculating an approximate signal delay time in a semiconductor integrated circuit (LSI) by calculating a voltage waveform of a signal by using terms of an admittance up to n-th order obtained by performing Laplace transform for the LSI after an output terminal of a cell in the LSI is modeled by using a power source voltage in a ramp waveform and an internal resistance of the cell in which an output signal change initiation time and an output signal transition time at the output terminal are used as parameters based on following two functions, a function of a signal delay time at the output terminal of the cell in the LSI using variables of an input signal transition time and a load capacitance of the output terminal of the cell which is a functional element in the LSI, and a function of the output signal transition time at the output terminal using variables of the input signal transition time and the load capacitance of the output terminal of the cell, which comprising:

first step of calculating an admittance of the LSI by performing Laplace transform;

first step of calculating an internal resistance;

second step of calculating an internal resistance of the output terminal based on a function of the output signal transition time using variables of the load capacitance of the output terminal and the input signal transition time;

third step of calculating the output signal change initiation time and the output signal transition time by using a linear function of time for the output signal change at the output terminal by using the internal resistance obtained in the second step as a fixed value;

fourth step of calculating, in order to have a model of the output terminal in the cell, the output signal change initiation time by fixing the internal resistance obtained in the second step and the output signal transition time obtained in the third step and by changing only the output signal change initiation time;

fifth step of calculating a first voltage waveform obtained by Laplace transform by using a power source voltage having the internal resistance obtained in the second step, the output signal change initiation time obtained in the fourth step, and the output signal transition time obtained in the third step;

sixth step of calculating a second voltage waveform obtained by Laplace transform of an optional position in the LSI by using the admittance obtained in the first step, the internal resistance obtained in the second step, and the first voltage waveform obtained in the fifth step;

seventh step of calculating a real-time approximate voltage waveform of the second voltage waveform by obtaining poles and residues of the second voltage waveform;

eighth step of calculating a signal delay time in the LSI based on the real-time voltage waveform obtained in the seventh step; and ninth step of judging whether the signal delay time obtained in the eighth step is within an acceptable precision range when one or more poles obtained in the seventh step include a real-number part of not more than zero.

11. The computer program product according to claim 8, wherein the signal delay time obtained is selected when it is judged that the signal delay time obtained in the sixth step is within the acceptable precision range, and wherein the signal delay time obtained is not selected when it is judged that the signal delay time obtained in the sixth step is not within the acceptable precision range, and further performing the calculation step for the approximate signal delay time by using terms of the admittance of more or less than n-th order.

12. The computer program product according to claim 10, wherein the signal delay time obtained is selected when it is judged that the signal delay time obtained in the sixth step is within the acceptable precision range, and wherein the signal delay time obtained is not selected when it is judged that the signal delay time obtained in the sixth step is not within the acceptable precision range, and further performing the calculation step for the approximate signal delay time by using terms of the admittance of more or less than n-th order.

* * * * *